(12) United States Patent
Nishio

(10) Patent No.: US 6,252,157 B1
(45) Date of Patent: Jun. 26, 2001

(54) AMORPHOUS SILICON-BASED THIN FILM PHOTOVOLTAIC DEVICE

(75) Inventor: Hitoshi Nishio, Shiga (JP)

(73) Assignee: Kaneka Corporation, Osaka (JP)

( * ) Notice: Subject to any disclaimer, the term of this patent is extended or adjusted under 35 U.S.C. 154(b) by 0 days.

(21) Appl. No.: 09/524,842

(22) Filed: Mar. 14, 2000

(30) Foreign Application Priority Data

Jul. 15, 1999 (JP) ................................................. 11-201791

(51) Int. Cl.⁷ .................... H01L 31/0376; H01L 31/0216
(52) U.S. Cl. ........................ 136/257; 136/256; 136/258; 136/259; 257/432; 257/434; 257/437; 257/436; 257/53
(58) Field of Search ..................................... 136/257, 256, 136/258 AM, 259; 257/432, 434, 437, 436, 53

(56) References Cited

U.S. PATENT DOCUMENTS

| | | | |
|---|---|---|---|
| 4,066,815 | * | 1/1978 | Olink et al. ............................ 428/336 |
| 5,077,133 | | 12/1991 | Cheng ................................... 428/426 |
| 5,449,413 | * | 9/1995 | Beauchamp et al. ................. 136/257 |
| 5,656,098 | | 8/1997 | Ishikawa et al. ..................... 136/256 |

FOREIGN PATENT DOCUMENTS

| | | |
|---|---|---|
| 849808 | * 6/1998 | (EP) . |
| 0849808 A2 | 6/1998 | (EP) . |
| WO 98/11031 | 3/1998 | (WO) . |

OTHER PUBLICATIONS

Patent Abstracts of Japan, Abstract for JP 9–162435, Jun. 1997.
Patent Abstracts of Japan, Abstract for JP 57–149845, Sep. 1982.

* cited by examiner

Primary Examiner—Alan Diamond
(74) Attorney, Agent, or Firm—Hogan & Hartson L.L.P.

(57) ABSTRACT

An amorphous silicon-based thin film photovoltaic device having a glass substrate and a laminate structure formed on the glass substrate and consisting of a transparent electrode, a semiconductor layer containing an amorphous silicon-based semiconductor and a back electrode, in which the glass substrate has a transmittance of 88 to 90% for light having a wavelength of 700 nm and 84 to 87% for light having a wavelength of 800 nm.

7 Claims, 1 Drawing Sheet

AMORPHOUS SILICON-BASED THIN FILM PHOTOVOLTAIC DEVICE

CROSS-REFERENCE TO RELATED APPLICATION

This application is based upon and claims the benefit of priority from the prior Japanese Patent Application No. 11-201791, Jul. 15, 1999, the entire contents of which are incorporated herein by reference.

BACKGROUND OF THE INVENTION

The present invention relates to an amorphous silicon-based thin film photovoltaic device.

It is well known to the art that a thin film photovoltaic device having an amorphous silicon-based photovoltaic unit, e.g., a solar battery, lacks stability. To be more specific, when the carrier excited by irradiated light is recombined within amorphous semiconductor layer, the bonding state of silicon atom is changed by the energy released in the step of the recombination, with the result that new recombination centers are formed in the forbidden band. As a result, the film property such as photo-conductivity of the photovoltaic silicon layer is lowered, eventually conversion efficiency will be lowered. This phenomenon appears most prominently when energy is consumed within the device as is in an open circuit state. Incidentally, it is known to the art that, if the deteriorated photovoltaic device is subjected to a heat treatment at approximately 150° C., the change noted above is moderated so as to restore again the conductivity. This phenomenon is called Staebler-Wronski effect.

It is known to the art to form, for example, a buffer layer between the p-layer and the i-layer of a pin-type photovoltaic unit in order to suppress deterioration of the amorphous silicon-based thin film photovoltaic device. However, it is difficult to form accurately the buffer layer having an appropriate impurity concentration.

On the other hand, the glass substrate material used in the conventional amorphous silicon-based thin film photovoltaic device is selected in view of improving only initial characteristics or cost. In other words, deterioration of characteristics is not taken into account in selecting the glass substrate material. Such being the situation, the deterioration of characteristics remains to be a practical problem in the conventional photovoltaic device, though it may be possible to obtain satisfactory characteristics in the laboratory level.

BRIEF SUMMARY OF THE INVENTION

An object of the present invention is to provide a stable amorphous silicon-based thin film photovoltaic device using a suitable glass substrate material and, thus, exhibiting good initial characteristics while suppressing deterioration of characteristics.

According to the present invention, there is provided an amorphous silicon-based thin film photovoltaic device, comprising a glass substrate, and a laminate structure formed on the glass substrate and consisting of a transparent electrode, a semiconductor layer containing an amorphous silicon-based semiconductor and a back electrode, wherein the glass substrate has a transmittance of 88 to 90% for light having a wavelength of 700 nm and 84 to 87% for light having a wavelength of 800 nm.

In the amorphous silicon-based thin film photovoltaic device of the present invention, it is desirable for the transparent electrode to be formed of a transparent conductive oxide having an irregular structure and for the back electrode to be formed of a light reflective metal or a stack of a transparent conductive oxide and a light reflective metal. The particular construction is called an optical confinement structure. The light reflective metal used in the present invention includes, for example, Ag, Au, Al, Cu, Pt and alloys thereof. The transparent conductive oxide used in the present invention includes, for example, ITO, $SnO_2$ and ZnO.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
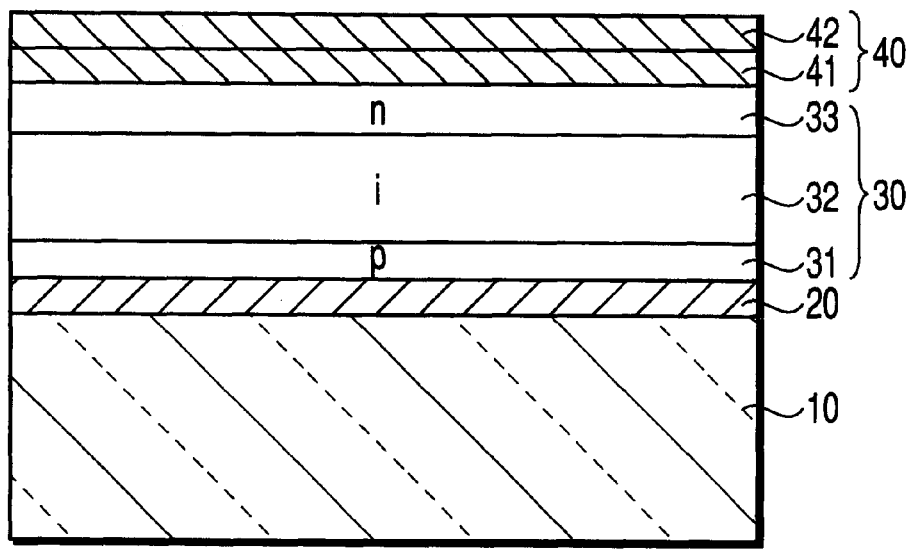
FIG. 1 is a cross sectional view showing an example of the thin film photovoltaic device of the present invention.

An amorphous silicon-based thin film photovoltaic device of the present invention comprises a glass substrate and a laminate structure formed on the glass substrate and consisting of a transparent electrode, a semiconductor layer containing an amorphous silicon-based semiconductor and a back electrode.

If the glass substrate has a high light transmittance, a large amount of carriers are generated within the amorphous silicon-based semiconductor layer, leading to an increased power generation, particularly current generation, of the photovoltaic device. However, since the number of carriers recombined within the semiconductor layer is also increased, the photovoltaic device tends to be deteriorated. On the other hand, if the light transmittance of the glass substrate is low, the power generation is diminished, though the photovoltaic device is less deteriorated. Such being the situation, a glass substrate having the light transmittance adjusted optimum is used in the present invention so as to suppress the deterioration without lowering the power generation of the photovoltaic device.

In the present invention, a glass substrate having a light transmittance of 88 to 90% for the light having a wavelength of 700 nm and 84 to 87% for the light having a wavelength of 800 nm is used. The transmittance of the light having a wavelength not shorter than 700 nm can be controlled by adjusting the composition of the metal oxide, e.g., iron oxide, constituting the glass substrate. It should be noted that the amorphous silicon-based semiconductor layer is effectively sensitive to light having a wavelength up to about 800 nm. In the case of using a glass substrate having the above noted values of transmittance of light having a wavelength of 700 nm to 800 nm, the deterioration can be suppressed without lowering the power generation of the photovoltaic device.

It is necessary for the glass substrate to be thick enough to withstand a wind pressure of 225 kg/m², as specified in IEC 1215 standards. For obtaining a mechanical strength high enough to withstand the wind pressure noted above, it is necessary for the glass substrate sized 100 cm×50 cm to have a thickness of 4 mm and for the glass substrate sized 100 cm×100 cm to have a thickness of 5 mm.

Naturally, used in the present invention is a glass substrate having a thickness, e.g., 4 mm, large enough to enable the glass substrate to exhibit the mechanical strength satisfying the IEC standards in respect of the resistance to the wind pressure and also having the light transmittance described above. The particular glass substrate can be prepared by, for example, controlling the iron oxide content of the glass substrate or by adhering a glass substrate having a high iron oxide content to a reinforcement glass plate low in iron oxide content such that the structure has a thickness, e.g., 4 mm, large enough to enable the structure to exhibit a desired mechanical strength satisfying the IEC standards in respect of the resistance to the wind pressure.

The amorphous silicon-based thin film photovoltaic device of the present invention is constructed as follows.

Specifically, a transparent electrode is formed on the glass substrate. It is desirable for the material of the transparent electrode to have a high transmittance not lower than 80% for light having a wavelength of 500 to 1200 nm. The transparent electrode is formed of a transparent conductive oxide including, for example, $SnO_2$, ZnO and ITO. Among these materials, $SnO_2$ is particularly desirable in terms of the transmittance, conductivity and chemical stability. ITO is also desirable in terms of the workability, conductivity and transmittance. The transparent electrode is formed by, for example, a vacuum deposition, thermal CVD or sputtering method. It is desirable for the transparent electrode to have a structure advantageous in optical confinement such as an irregular structure.

Formed on the transparent electrode is a photovoltaic unit made of semiconductor layers containing an amorphous silicon-based semiconductor, e.g., a laminate structure consisting of a p-type a-Si:H layer, an i-type a-Si:H layer and an n-type microcrystalline Si:H layer. Any of the semiconductor layers included in the photovoltaic unit is deposited by a plasma CVD method in which the temperature of the substrate is set at 400° C. or lower. The plasma CVD method employed in the present invention includes, for example, a parallel plate type RF plasma CVD that is widely known to the art and a plasma CVD utilizing a high frequency power source ranging from an RF zone of a frequency of 150 MHz or less to a VHF zone. Incidentally, it is possible to irradiate the deposited semiconductor layer with pulsed laser light (laser annealing) for controlling crystallinity and carrier concentration.

A back electrode is formed on the photovoltaic unit. It is desirable for the back electrode to be of a laminate structure consisting of, for example, a transparent conductive oxide and a light reflective metal, though it is possible to use a light reflective metal only. It is desirable to use a transparent conductive oxide because the particular oxide improves the adhesiveness of the light reflective metal layer so as to improve the reflection efficiency and serves to protect the photovoltaic unit from a chemical change. The transparent conductive oxide used in the present invention is selected from the group consisting of ITO, $SnO_2$ and ZnO. It is particularly desirable to use a ZnO-based transparent conductive oxide. It is desirable for the ZnO-based transparent conductive oxide layer to have a thickness of 50 nm to 1 μm and a resistivity not higher than $1.5 \times 10^{-3} \Omega \cdot cm$. The light reflective metal layer can be formed by a vacuum deposition or sputtering method. It is desirable for the light reflective metal to be selected from the group consisting of Ag, Au, Al, Cu, Pt and alloys containing these metals. For example, it is desirable to form a light reflective metal by vapor deposition of Ag having a high light reflectivity at 100 to 330° C., preferably 200 to 300° C. It is also possible to form a light reflective metal by a sputtering method at room temperature.

The present invention will now be described with reference to Examples.

In the first step, three kinds of glass substrates (a) to (c) given below were prepared. Each of these glass substrates contained 73% by weight of the main component $SiO_2$, 14 to 15% by weight of $Na_2O$, about 10% by weight of CaO, MgO, $Al_2O_3$, $Fe_2O_3$ and traces of other components. The transmittance of light having a wavelength not shorter than 700 nm is most greatly affected by the $Fe_2O_3$ content of the glass substrate.

(a) 4 mm-thick low-iron flat glass
   $Fe_2O_3$ content: 0.01 wt %
   Transmittance to light having wavelength of 700 nm: 90.1%
   Transmittance to light having wavelength of 800 nm: 89.3%

(b) 4 mm-thick conventional flat glass
   $Fe_2O_3$ content: 0.1 wt %
   Transmittance to light having wavelength of 700 nm: 85.1%
   Transmittance to light having wavelength of 800 nm: 80.8%

(c) 1.8 mm-thick conventional flat glass
   $Fe_2O_3$ content: 0.1 wt %
   Transmittance to light having wavelength of 700 nm: 89.6%
   Transmittance to light having wavelength of 800 nm: 86.8%

An amorphous solar battery having a structure as shown in FIG. 1 was prepared by using each of these glass substrates. As shown in the drawing, formed on a glass substrate 10 were a transparent electrode 20 made of $SnO_2$, a photovoltaic unit 30 consisting of a p-type amorphous silicon layer 31, an i-type amorphous silicon layer 32 and an n-type amorphous silicon layer 33, and a back electrode 40 having a laminate structure consisting of a transparent conductive oxide layer 41 made of ZnO and a light reflective metal layer 42 made of Ag. Light is incident on the substrate 10 of the photovoltaic device.

Measurement were performed with respect to the open-circuit voltage $V_{oc}$, short-circuit current density $J_{sc}$, fill factor FF and conversion efficiency $E_{ff}$ of the solar battery formed on each of the glass substrates. The measurement was performed immediately after manufacture (initial characteristics) and after light irradiation in an amount corresponding to light irradiation for one year. The light irradiation equivalent to the light irradiation for one year is equal to the condition that the solar battery was irradiated with light of AM 1.5 having an output of 100 mW/cm² for 550 hours at 48° C. The stability of the solar battery was evaluated by calculating the ratio of the conversion efficiency $E_{ff}$ after the one-year equivalent light irradiation to the initial conversion efficiency. Table 1 shows the results.

| | initial characteristics | | | | characteristics after one-year equivalent light irradiation | | | | |
|---|---|---|---|---|---|---|---|---|---|
| glass substrate | $V_{oc}$ (V) | $J_{sc}$ (mA/cm$^2$) | FF (%) | $E_{ff}$ (%) | $V_{oc}$ (V) | $J_{sc}$ (mA/cm$^2$) | FF (%) | $E_{ff}$ (%) | $E_{ff}$ ratio relative to initial value |
| (a) 4 mm low-iron flat glass | 0.86 | 16.7 | 72 | 10.18 | 0.85 | 16.0 | 59 | 8.00 | 0.79 |
| (b) 4 mm conventional flat glass | 0.86 | 16.1 | 75 | 10.04 | 0.85 | 15.3 | 63 | 8.27 | 0.82 |
| (c) 1.8 mm conventional flat glass | 0.86 | 16.2 | 72 | 10.28 | 0.85 | 15.5 | 62 | 8.57 | 0.83 |

As apparent from Table 1, the sample using the low-iron flat glass having a high light transmittance is superior in the initial characteristics to the sample using the conventional flat glass low in light transmittance, if each glass substrate has the same thickness (4 mm). However, the sample using the low-iron flat glass substrate incurs a marked reduction in $E_{ff}$ and, thus, is poor in stability. On the other hand, the sample using the 1.8 mm-thick conventional flat glass was found to be satisfactory in each of the initial characteristics and the stability. It is considered reasonable to understand that the 1.8 mm-thick flat glass exhibited an appropriate transmittance of light having a wavelength of 700 to 800 nm, leading to the satisfactory results.

In order to enable the glass substrate of a thickness of 4 mm, which has a mechanical strength high enough to withstand a predetermined wind pressure, to be equivalent to the 1.8 mm-thick glass substrate in the transmittance of light having a wavelength of 700 to 800 nm, it is appropriate to control the $Fe_2O_3$ content at 0.026 to 0.065% by weight.

Figure 2:
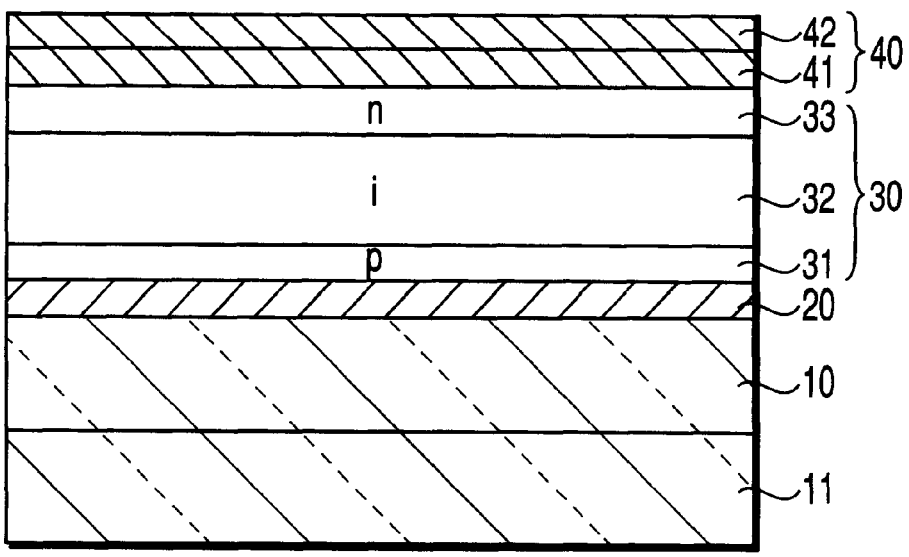
FIG. 2 is a cross sectional view showing another example of the thin film photovoltaic device of the present invention.

Alternatively, as shown in FIG. 2, it is possible to adhere a reinforcement glass substrate 11 consisting of, for example, a 2.2 mm-thick low-iron flat glass to the glass substrate 10 consisting of a 1.8 mm-thick conventional flat glass, on which a laminate structure same as that of FIG. 1 is formed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An amorphous silicon-based thin film photovoltaic device, comprising:
   a glass substrate; and
   a laminate structure formed on the glass substrate and consisting of a transparent electrode, a semiconductor layer containing an amorphous silicon-based semiconductor and a back electrode,
   wherein the glass substrate has a transmittance of 88 to 90% for light having a wavelength of 700 nm and 84 to 87% for light having a wavelength of 800 nm.

2. The photovoltaic device according to claim 1, wherein said glass substrate has a thickness large enough to obtain a mechanical strength sufficient for withstanding a wind pressure.

3. An amorphous silicon-based thin film photovoltaic device, comprising:
   a glass substrates; and
   a laminate structure formed on the glass substrate and consisting of a transparent electrode a semiconductor layer containing an amorphous silicon-based semiconductor and a back electrode, wherein the glass substrate has a transmittance of 88 to 90% for light having a wavelength of 700 nm and 84 to 87% for light having a wavelength of 800 nm and said glass substrate contains 0.026 to 0.065% by weight of iron oxide.

4. An amorphous silicon-based thin film photovoltaic device, comprising:
   a glass substrates; and
   a laminate structure formed on the glass substrate and consisting of a transparent electrode, a semiconductor layer containing an amorphous silicon-based semiconductor and a back electrode, wherein the glass substrate has a transmittance of 88 to 90% for light having a wavelength of 700 nm and 84 to 87% for light having a wavelength of 800 nm and said glass substrate is prepared by adhering a glass substrate having a relatively high iron oxide content to a reinforcement glass plate having a relatively low iron oxide content.

5. The photovoltaic device according to claim 1, wherein a transparent conductive oxide layer forming said transparent electrode has an irregular structure, and said back electrode is formed of a light reflective metal layer or a laminate structure consisting of a transparent conductive oxide layer and a light reflective metal layer.

6. The photovoltaic device according to claim 5, wherein said light reflective metal is selected from the group consisting of Ag, Au, Al, Cu, Pt and alloys thereof.

7. The photovoltaic device according to claim 5, wherein said transparent conductive oxide is selected from the group consisting of ITO, $SnO_2$ and ZnO.

* * * * *